United States Patent [19]

Lee et al.

[11] Patent Number: 5,049,982

[45] Date of Patent: Sep. 17, 1991

[54] ARTICLE COMPRISING A STACKED ARRAY OF ELECTRONIC SUBASSEMBLIES

[75] Inventors: Yung-Cheng Lee, Boulder, Colo.; John M. Segelken, Morristown, N.J.

[73] Assignee: AT&T Bell Laboratories, Murray Hill, N.J.

[21] Appl. No.: 519,728

[22] Filed: May 10, 1990

Related U.S. Application Data

[63] Continuation-in-part of Ser. No. 387,480, Jun. 6, 1989, abandoned.

[51] Int. Cl.$^5$ ............................................. H01L 23/02
[52] U.S. Cl. .......................................... 357/81; 357/75
[58] Field of Search .................................... 357/81, 75

[56] References Cited

U.S. PATENT DOCUMENTS 3,727,114  4/1973  Oshima ................................ 317/234

FOREIGN PATENT DOCUMENTS 0234762  12/1985  Japan ..................................... 357/75

OTHER PUBLICATIONS

IBM Technical Disclosure Bulletin, vol. 28 No. 2, Jul. 1985, "Bipolar-Fet Package Design".

Primary Examiner—Eugene R. LaRoche
Assistant Examiner—R. Ratliff
Attorney, Agent, or Firm—M. I. Fihston; E. E. Pacher

[57] ABSTRACT

Disclosed is an article comprising a stacked array of electronic subassemblies, each subassembly including one or more integrated circuits and a thermally conductive base member that is perforated with holes. Motivating means are provided for causing a coolant fluid to pass through the holes in a direction substantially parallel to the stacking axis.

11 Claims, 3 Drawing Sheets

ARTICLE COMPRISING A STACKED ARRAY OF ELECTRONIC SUBASSEMBLIES

CROSS-REFERENCE TO RELATED APPLICATION

This application is a continuation-in-part of our application Ser. No. 387,480 filed June 6, 1989 and now abandoned.

FIELD OF THE INVENTION

This application pertains to articles that comprise a stacked array of electronic subassemblies.

BACKGROUND OF THE INVENTION

Conventional techniques for packaging large numbers of integrated circuits (ICs) make use of individual circuit boards. However, as the number of ICs mounted on a single board becomes very large, it becomes difficult to fit all of the necessary interconnections on the board. Moreover, as circuit boards are made larger in order to accommodate increasing numbers of ICs, signal propagation delays are added. In many cases, for example in the design of computers, such additional delay is undesirable, because it reduces processing speed, whereas the very reason for interconnecting very large numbers of components is to create the capacity to process information at a high rate.

As a result of these considerations, designers of electronic devices, for example, of computers, are introducing techniques of three dimensional (3D) packaging. In 3D packaging, rather than mounting the large numbers of ICs on individual circuit boards, designers mount them on multiplicities of circuit boards (or other base members) that are arranged in relatively closely spaced stacks. In a conventional circuit board, all of the electrical interconnections extend along a single plane. A 3D package, by contrast, incorporates not only conventional planar interconnections within single circuit boards, but also interconnections, here called "vertical interconnections," between different boards. In addition, many schemes for 3D packaging include a special circuit board, here called an I/O board. All signals entering or leaving the 3D package pass through the I/O board. Thus, the I/O board incorporates the input and output connections for the 3D package as a whole. The I/O board may be connected to any or all of the other individual circuit boards.

As a result of 3D packaging, some propagation delays are reduced by providing shorter electrical connections and reducing parasitic capacitance along the propagation path. In addition, electrical interconnections are simplified by providing an additional direction, namely the vertical direction, for interconnection. Furthermore, by dividing the total IC-bearing area among a multiplicity of individual circuit boards, 3D packaging can increase the average circuit-board edge length per IC, thus providing more room at the edges of the circuit boards for mounting electrical terminals for interconnections.

These benefits of 3D packaging have made it possible to design packages having a very high volume density of ICs, for example, computing devices having more than 600 VLSI ICs packed in a volume of only about 140 cubic centimeters. Such compact packaging is desirable, for example, for making desktop computers having the power of mainframe computers, or for making computing devices to be installed on aircraft or satellites. However, at such high densities, the removal of heat becomes a significant problem. Hundreds of watts of thermal power may need to be removed from relatively compact packages having a maximum lateral extent of, for example, less than about 10 cm.

Various techniques of heat removal have been applied to 3D packages. For example, various closed-cycle refrigeration systems have been proposed. These include cooling of the 3D package by immersion in a refrigerated coolant, or cooling by thermally contacting the circuit boards with cold plates internally cooled by circulating, refrigerated coolant. Such refrigerated cooling systems are disadvantageous in applications where extreme economy of space is required, because the volume occupied by the refrigeration apparatus makes a significant contribution to the total volume of the package.

Other approaches have used channels, such as tubes or heat pipes, for circulating coolant fluid between a region of a circuit board that is populated with ICs and a heat exchanger. Such a heat exchanger may comprise, for example, fins that are open to the atmosphere, or it may be cooled by a closed-cycle refrigeration system. The use of such circulation channels may be disadvantageous because it is a relatively expensive approach, and heat exchangers may make an undesirable contribution to the total volume of the electronic package.

Still other approaches have relied upon the thermal conduction of heat through a plate or heat sink to a radiative or heat-exchanging structure in contact with the atmosphere. For example, U.S. Pat. No. 4,027,206, issued to Lawrence Y. Lee on May 31, 1977, describes a highly thermally conductive heat sink to which solid state electronic components are secured, and upon which radiator fins are mounted. A circuit board, carrying circuitry, may be mounted directly on the heat sink. The radiator fins are cooled by forced air flowing substantially parallel to the plane of the circuit board or heat sink. A multiplicity of assemblies of circuit boards and heat sinks may be mounted within an enclosure, and the associated radiator fins may be cooled by airflow within the enclosure.

Similarly, U.S. Pat. No. 4,502,098, issued to David F. Brown and Michael J. Anstey on Feb. 25, 1985, describes a circuit assembly in which a multiplicity of plates, carrying integrated circuits, are supported in a stack within a mounting structure having walls. The structure is cooled by directing air through perforations in the walls, such that the air flows over and between the circuit-bearing plates in a direction substantially parallel to the plates. Alternatively, fins can be mounted on the external surfaces of the walls. In that case, heat is conducted, via the plates and the walls, to the fins, which are convectively cooled.

Also similarly, U.S. Pat. No. 4,536,824, issued to Howard W. Barrett and Paul F. Fledderjohann on Aug. 20, 1985, describes a 3D package incorporating cooling channels mounted between ICs and a printed circuit board. The channels are either metal tubes underlying the ICs, or bores in a metal plate that lies under or adjacent the ICs. The package is cooled by forced air flowing through the channels in a direction substantially parallel to the printed circuit boards.

The above-described air-cooled packaging techniques offer certain disadvantages where cooling of very compactly packaged ICs must be achieved while making extremely efficient use of space. Fins are wasteful of space and add possibly undesirable extra weight. Coolant channels are relatively expensive, add weight, and limit the vertical stacking density of circuit boards. More generally, whenever cooling air is directed parallel to the circuit boards, resistance to the flow of air is offered by cool surfaces and by relatively thermally non-conductive surfaces as well as by warm, thermally conductive surfaces, thus reducing the efficiency of the cooling process. This problem can become even more severe as the vertical packing density of circuit boards is reduced, because the resulting constriction of the spaces between successive circuit boards can increase the resistance to flow of the coolant air.

SUMMARY OF THE INVENTION

The present invention provides a 3D package in which a multiplicity of densely vertically packed, populated circuit boards (or other support members) can be efficiently cooled by the forced flow of coolant along a direction substantially parallel to the stacking axis, and thus substantially perpendicular to the circuit boards.

In a general sense, the invention is an electronic article comprising a multiplicity of essentially planar electronic subassemblies, such as printed wiring boards, supported in a vertical stack such that the subassemblies overlap each other and are substantially perpendicular to a stacking axis. Moreover, each subassembly comprises a thermally conductive base member, which may be the circuit board itself, or may be, for example, a metal film or metal plate underlying the circuit board. Each base member is perforated by holes passing through it in a substantially vertical direction, that is, substantially parallel to the stacking axis. The holes are so arranged that a fluid coolant, set in motion by impelling means, such as a pump or a fan, will readily pass through all of the base members by flowing through at least some of the holes in each member. The holes induce turbulence in the coolant flow. This turbulence enhances the thermal contact between the coolant and at least some of the major surfaces of the subassemblies. As a consequence, a substantial portion of the cooling takes place at major surfaces (i.e., surfaces that are substantially perpendicular to the stacking axis and to the principle flow direction). By contrast, the use of fins for cooling relies upon either laminar or turbulent flow near the cooling surfaces, and the cooling surfaces of fins extend along the principle flow direction.

In at least one embodiment of the invention, the subassemblies comprise silicon-on silicon or silicon-on-ceramic multichip modules, which are mounted on base members comprising thermally conductive printed wiring boards. Sandwiched between the printed wiring boards in spacer material capable of conducting electrical signals in a vertical direction. The stack is clamped together by, for example, a multiplicity of threaded bolts passing vertically through the stack from one side, and engaging tightenable nuts on the other side.

Each printed wiring board has a peripheral region that is perforated by holes. Air is drawn in by a fan and passes through the holes, cooling the subassemblies.

Because the coolant air passes through the package in a direction substantially parallel to the stacking axis, a single fan mounted at the end of the package can be used to draw coolant air through the stack of subassemblies. As a consequence of this arrangement, the number of subassemblies in the package, and thus the length of the stack, can be increased without any need to enlarge the fan (to intercept a larger area), or to add more fans.

As a further consequence of this arrangement, an increase in the vertical packing density of the subassemblies results in only a relatively modest increase in the resistance of the package to the flow of coolant air.

DETAILED DESCRIPTION

As a pedagogical aid to a more complete understanding of the invention, a specific embodiment of the invention is described below.

Figure 1:
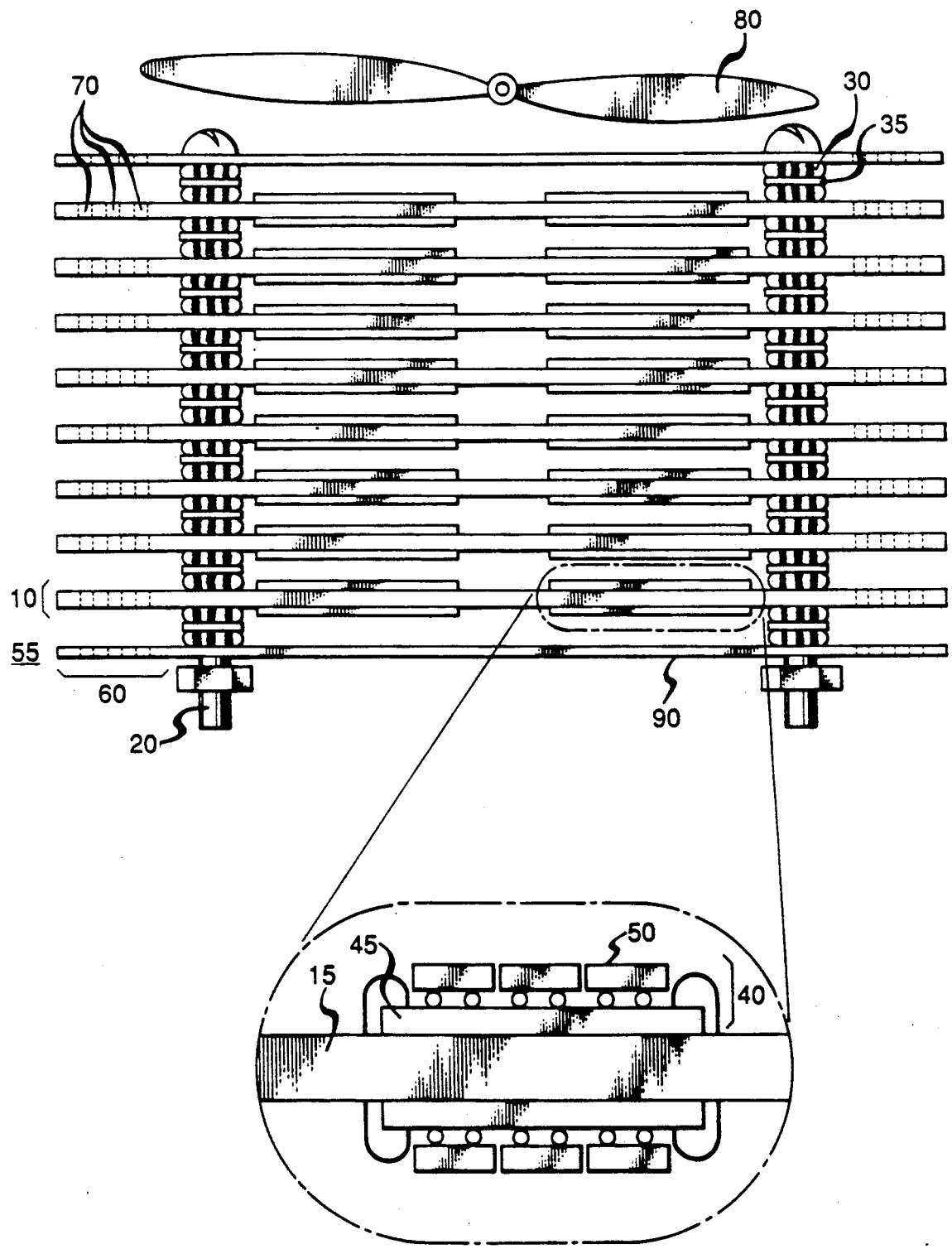
FIG. 1 is a schematic end view showing one example of a 3D package for an electronic device made in accordance with the invention.

With reference to FIG. 1, circuit packs 10 are mounted on bolts 20 and vertically interconnected to each other by connective elements 30. The connective elements 30 are composed, for example, of material sold by AT&T under the tradename Conductive Polymer Interconnect (CPI). CPI is an elastic, compressible, sheet-like material that conducts electricity only in the vertical direction; i.e., in the direction perpendicular to the major surfaces of a sheet of the material. Thus, electrical connections between aligned contacts on facing surfaces of adjacent circuit packs are readily made by sandwiching a sheet of CPI between the circuit packs and slightly compressing the sheet between the circuit packs. Significantly, circuit packs that are interconnected in this manner are not separated by air gaps, because at least part of the space between them is filled by the CPI. As a result, it is impossible to air-cool such packages in the conventional way, by flowing air through air gaps between circuit packs in a direction substantially parallel to the major surfaces of the circuit packs.

Additional vertical spacing between successive circuit packs is readily achieved by sandwiching more than one sheet of CPI between the circuit packs. Spacers 35 can be interposed between each pair of such CPI sheets. Suitable spacers comprise, for example, pieces of pc board containing vias, i.e., mutually electrically isolated, metal-lined holes capable of conducting electrical signals from one side of the pc board to the other.

Alternatively, the connective elements 30 may be, for example, elements sold by AMP under the tradename Interposer, or button contacts sold under the tradename CIN-APSE by Cinch, a division of Labinal Components and Systems, Inc.

Each circuit pack 10 comprises a substrate 15, here called a primary substrate, having a pattern of electric conductors formed on it, and having one or more multichip modules 40 mounted on it in electrical contact with the conductor pattern. The primary substrate is thermally conductive. The primary substrate 15 may be made, for example, from a thermally conductive ceramic material such as aluminum nitride or silicon carbide. Alternatively, the primary substrate may be a composite printed wiring board structure in which the conductor pattern is formed on one or both outer surfaces of a composite, multiple-layer laminated body. The outer, i.e., top and bottom, layers of the laminated body are relatively thin, e.g., about 20-mils-thick (0.51 mm thick), layers of conventional, polymeric material. The core layer, between the top and bottom layers, is a relatively thick, e.g., about 40-mils-thick (1.02 mm thick), layer of highly thermally conductive material. The total thickness of the primary substrate is desirably in the range 30–75 mils (0.76–1.91 mm). The thickness is preferably about 40 mils (1.02 mm) because although thermal resistance tends to fall off as the substrate is made thicker, such decrease is relatively shallow for substrate thicknesses greater than about 40 mils (1.02 mm). The separation between primary substrates is desirably in the range 75–200 mils (1.91–5.08 mm). For air cooling, the separation is preferably about 100 mils (2.54 mm) because empirical observations suggest that at such separation, the air-flow pattern provides particularly effective cooling. Advantageously, the core layer is not only thermally conductive, but also highly electrically conductive, so that it can also be used as an electrical ground plane. Thus a preferred material for the core layer is, for example, aluminum, or, alternatively, a copper-molybdenum composite having a thermal coefficient of expansion close to that of the silicon or ceramic substrates of the multichip modules.

The primary substrate has two major surfaces, i.e., a top surface and a bottom surface, on which a conductor pattern may be formed. In addition, if the primary substrate comprises a composite, multi-layer laminated body, additional electrically conductive layers, in addition to the core layer, are readily formed intermediate the top and bottom layers. Such intermediate conductive layers are separated and electrically insulated from one another by layers of, for example, polymeric or ceramic material. Electrical contact is readily made from multichip modules mounted on a primary substrate to intermediate conductive layers within the substrate via apertures extending through the overlying layers.

The primary substrate represents the level of organization within the 3D package having a relatively large spatial scale. Thus, for example, the conductor pattern formed on the primary substrate typically has a line width of about 100–200 μm.

Mounted on each primary substrate 15 is at least one multichip module 40. Each multichip module comprises a silicon or ceramic substrate 45, here called a secondary substrate, having a pattern of electrical conductors formed on its top surface for electrically contacting integrated circuits 50. Electrical conductors in the form, for example, of wirebonds are also provided, for electrically connecting the conductor pattern on the top surface of the secondary substrate to the conductor pattern on the primary substrate 15 on which the multichip module is mounted. Mounted on the top surface of the secondary substrate, in electrical contact with the conductor pattern on that surface, is at least one integrated circuit 50.

The secondary substrate 45 represents the level of organization within the 3D package having an intermediate spatial scale. Thus, for example, the conductor pattern formed on the secondary substrate typically has a line width of about 10–20 μm. ICs are mounted directly on the top surface of the secondary substrate. The ICs represent the level of organization having a relatively small spatial scale. Thus, for example, ICs typically have a linewidth of about 1 μm.

Each primary substrate 15 has a pattern of electrical conductors formed on its top surface for electrically contacting the multichip modules 40 mounted on it, and may also have a similar pattern of electrical conductors on its bottom surface for mounting multichip modules on that surface as well.

Also formed on each primary substrate, in contact with the conductor patterns on that substrate, are contacts for electrically connecting the conductor patterns to the connective elements 30.

Each circuit pack 10 includes a cooling region 55. For example, a cooling region is readily formed which comprises an outer portion 60 of primary substrate 15. Outer portion 60 is substantially free of multichip modules or attached electronic components. This outer portion is perforated, e.g., drilled, with a multiplicity of holes 70. Outer portion 60 is intended to serve as a heat sink, and also as a heat exchanger, transferring heat from the primary substrate to air passing through the holes, as described below. Heat generated by the integrated circuits is conducted through the secondary substrates 45, and from the secondary substrates 45 to the primary substrates 15. Within the primary substrates, heat is conducted from the regions adjacent the multichip modules, toward the outer portions 60.

Ambient air is drawn through the holes in outer portions 60 by a fan 80, mounted at one end, e.g., the top end, of the stack of circuit packs. The action of the fan is to vent air in the upward direction, as viewed in FIG. 1, so that air is drawn from, e.g., the bottom end of the stack upward, through the holes in outer portions 60, to the fan and from the fan out to the ambient atmosphere. An example of an appropriate fan for cooling, e.g., a 250-watt device, is the fan sold under the tradename Muffin-XL.

Heat conducted through primary substrate 15 toward outer portion 60 is transferred at or near holes 70 to air passing through the holes as a result of the action of fan 80. Some heat is transferred through the walls of the holes to air (or other coolant fluid, e.g., coolant liquid impelled by a pump instead of a fan) passing through the holes. Significantly, it is believed that an even larger amount of heat is transferred to the cooling air (or other coolant fluid) from one or both major surfaces of the primary substrate. That is, the holes induce turbulence in the flow of coolant. It is believed that through mixing of warmer and cooler portions of the coolant fluid and/or regrowth of the boundary layer, this turbulence increases thermal contact between the coolant and those portions of the major surfaces that are adjacent to the holes. As a consequence, a substantial amount of heat is transferred from at least one major surface of each perforated base member to the coolant.

The sizes and distribution of cooling holes on a circuit pack are readily adjusted in accordance with local cooling requirements. For example, if a particular circuit pack has a substantially higher power dissipation level than neighboring circuit packs, the rate of heat transfer from that circuit pack to the cooling air can be enhanced by providing the outer portion of the corresponding primary substrate with smaller and more densely distributed holes.

That is, the local rate of airflow may be greater in a smaller hole. Faster airflow can lead to greater turbulence, which can, in turn, increase the rate at which heat is transferred to the coolant fluid. Additionally, because the wall area of a hole is proportional to the square root of its facial area, smaller holes make more efficient use of substrate area in instances where substantial heat is transferred to coolant fluid through the walls of the holes.

Figure 2:
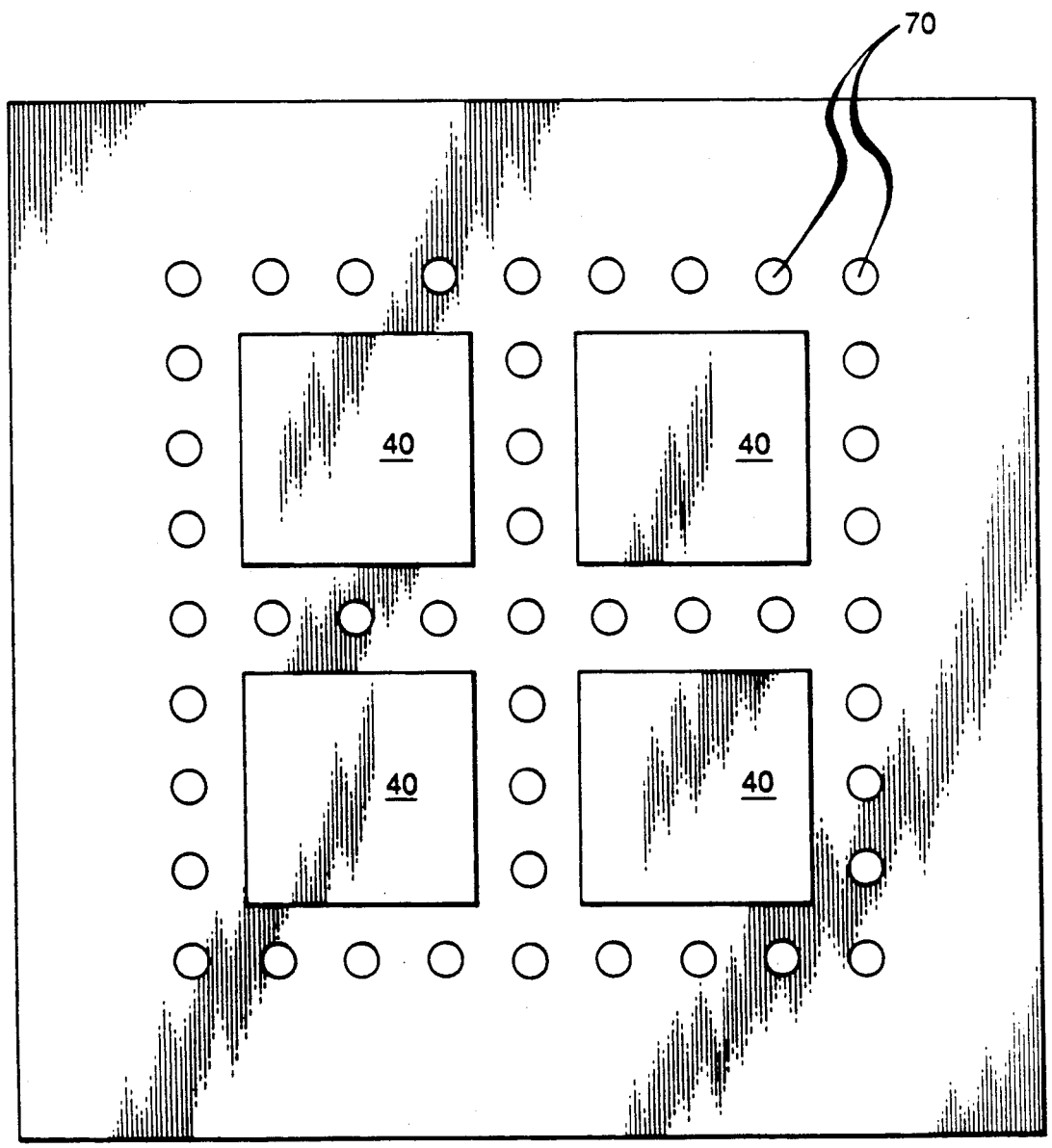
FIG. 2 is a schematic top view of a circuit pack made in accordance with the invention, showing an alternate arrangement of cooling holes.

In addition, holes can be formed in portions of the circuit pack other than the outer portion, in order to enhance the rate of cooling near sources of high thermal power. For example, the hottest region of the circuit pack is often in the center. Thus, as depicted in FIG. 2, holes 70 can be readily formed in the central portion of a circuit pack 10 in order to enhance the cooling of that portion.

Figure 3:
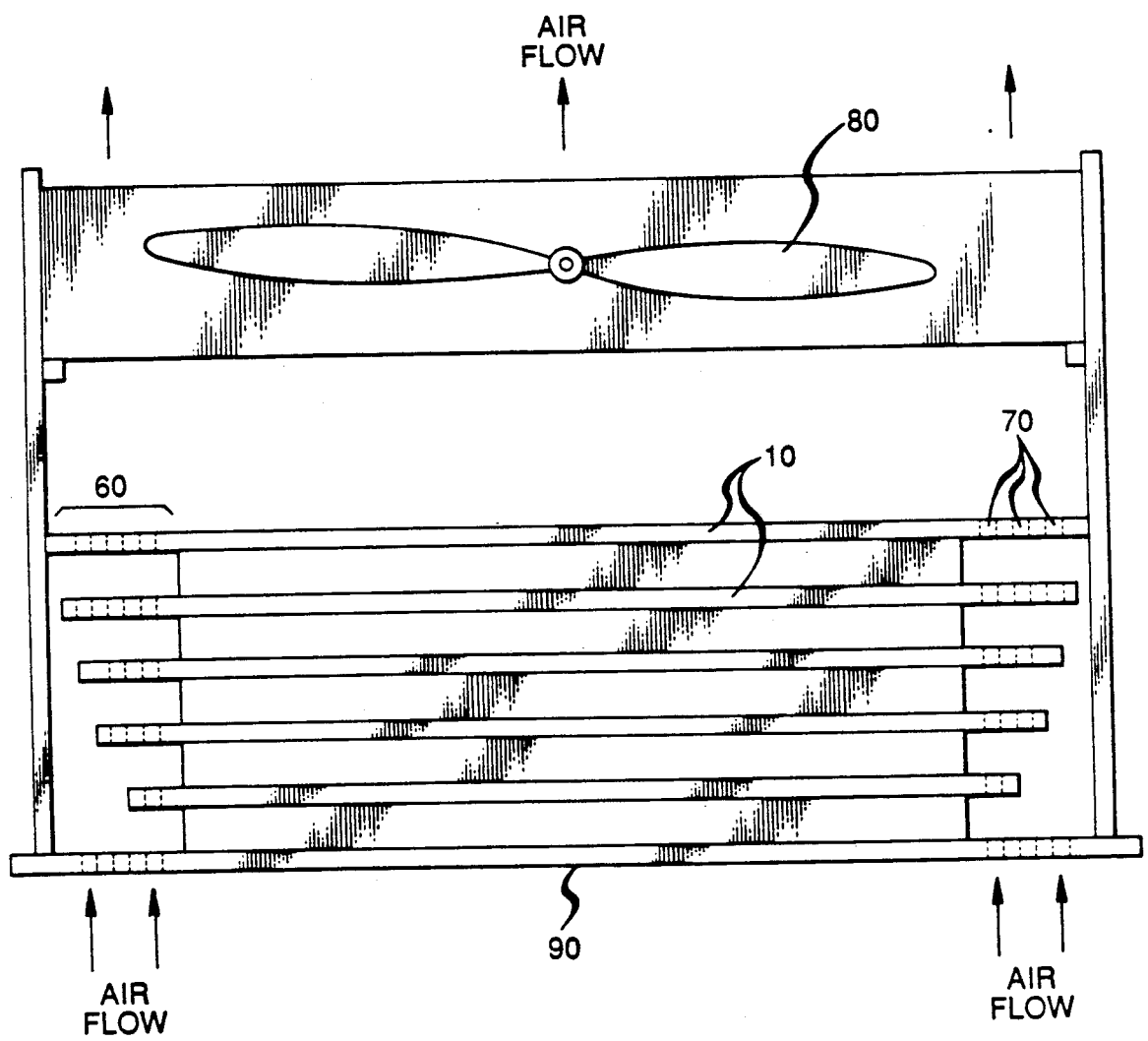
FIG. 3 is a schematic end view showing an example of a 3D package having primary substrates of graduated size.

In addition, as depicted, for example, in FIG. 3, the primary substrates are readily graduated in size in order to achieve a more uniform temperature distribution along the flow direction. That is, the cooling air tends to increase in temperature as it passes through successive circuit packs. As a result of the increase in temperature, the rate at which heat is transferred to the cooling air tends to decrease. This dropoff in cooling rate can be at least partially compensated by increasing the lateral extent of outer portion 60 in order to increase its effectiveness as a heat sink, and by increasing the heat-exchange area. If the outer portion 60 is increased in lateral extent, the heat-exchange area is also readily increased by increasing the number of holes 70.

Thus, even in a 3D package in which the power dissipation levels of the circuit packs vary by several hundred percent, the spatially averaged temperatures of all the circuit packs can be kept within a few Celsius degrees of each other by increasing the lateral extents of successive outer portions 60, increasing the numbers of cooling holes accordingly, and using an appropriate airflow velocity. The growth direction is upward (see FIG. 1) or downstream; that is, outer portions that are nearer the fan are larger than outer portions that are farther from the fan.

Figure 4:
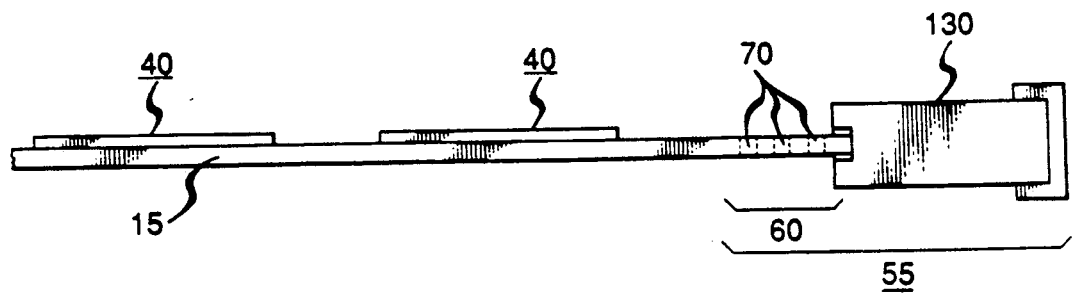
FIG. 4 is a schematic end view of a circuit pack made in accordance with the invention, comprising an alternate cooling region in the form of a perforated or porous heat sink.

A different example of cooling region 55 comprises a heat distributing element 130, as depicted, for example, in FIG. 4. Element 130 comprises a highly thermally conductive, perforated or porous heat sink that is physically distinct from primary substrate 15. Element 130 is thermally conductively attached to an edge of primary substrate 15, for example, by engaging the substrate edge in a slot in the edge of element 130, and affixing the substrate with solder or thermally conductive epoxy adhesive. Cooling air passes through the holes or pores in element 130 in a manner analogous to the passage of cooling air through the holes in outer portions 60. Elements 130 are readily used either in addition to, or instead of, perforated outer portions 60. An example of a porous element 130 is an aluminum or copper sponge mounted in a metal frame. Cooling air, or other coolant fluid, passes readily through the pores or interstices in such a metallic sponge.

In addition, wherever cooling holes are used, whether in outer portion 60 or in element 130, the transfer of heat to the cooling air is readily further enhanced by placing porous, highly thermally conductive material within some or all of the holes, in thermal contact with the material defining the sides of the holes. An example of material suitable for that purpose is metal sponge, or, alternatively, folded wire similar to button contacts, but relatively loosely packed in order to offer relatively low flow resistance to the cooling air.

Referring back to FIG. 1, the signals entering and leaving the 3D package enter and leave by way of a special circuit pack 90, here called the I/O circuit pack. The I/O circuit pack may occupy any circuit-pack position within the 3D package, and there may even be multiple I/O circuit packs. 3D package, and there may even be multiple I/O circuit packs. For ease of access, however, it is advantageous for the I/O circuit pack to be the bottom circuit pack (as viewed in FIG. 1); that is, the circuit pack occupying the end position farthest from fan 80. Contacts are provided on circuit pack 90 for electrically connecting electrical conductors bearing incoming or outgoing signals to the conductor pattern on circuit pack 90. Optical signals may enter and leave the I/O circuit pack in addition to electrical signals, or alternatively to electrical signals. Optical connectors are readily provided on circuit pack 90 for connecting incoming or outgoing lightwave channels, for example optical fibers, to optical or optoelectronic devices mounted on circuit pack 90.

Like the other circuit packs, I/O circuit pack 90 is readily provided with cooling holes in its outer portion.

In addition, I/O circuit pack 90 is readily used as a mother board. That is, it is readily made substantially larger than the other circuit packs, and used for mounting of large electronic components, or, for example, power conditioning components. The interconnections between the components mounted on circuit pack 90 may be, for example, by optical fibers, or by large-scale electrical means such as cables, or by small-scale means such as printed conductor patterns and wirebonds. If circuit pack 90 belongs to an electronic device comprising more than one 3D package such as is described here, circuit pack 90 may be used as the I/O circuit pack for a multiplicity of 3D packages, each incorporating a portion of circuit pack 90 as a circuit pack occupying an end position.

Other embodiments of the invention are also useful. For example, the 3D package may be immersed in a liquid coolant, and an impeller, such as a pump, may be employed to force the liquid coolant to flow through the 3D package in a substantially vertical direction, through the holes in the circuit packs. In that case, heat is transferred from the circuit packs to the liquid coolant in a manner analogous to the air-cooling process described above. Heat is readily removed from the liquid coolant by contact with a heat exchanger.

In a currently preferred embodiment, each primary substrate includes a copper core layer 12.7 cm square and 40 mils (1.02 mm) in thickness and has one major surface adapted for mounting four multichip modules. A peripheral area of the core layer about 1.5 cm wide, extending beyond the outer layers on all four sides, is perforated with cooling holes arranged in three staggered rows. The hole diameter is about 2.5 mm, and the separation between holes in the same row, and between the inner and outer rows, is about 0.8 cm. The vertical separation between primary substrates is about 2.5 mm. The hole patterns on alternate substrates are offset such that each hole falls on the median line between two holes of the preceding or following substrate.

EXAMPLE

A stack of eight perforated heat sinks was cooled by an electric exhaust fan. The heat sinks were perforated aluminum plates 1.52 mm in thickness. The cooling region of each plate consisted of a peripheral region 25.4 mm wide. The holes in the plates were 3.18 mm in diameter, and arranged in staggered rows with a pitch of 8.89 mm. A cooling rate of 250 watts was measured, while temperatures near the centers of the plates were maintained at less than 85° C.

I claim:

1. An article, comprising:
   (a) at least two primary substrates, each having two substantially planar, parallel major surfaces which are electrically insulating, each primary substrate incorporating at least one thermally conductive layer, to be referred to as a "thermally conductive member;"
   (b) means for supporting the primary substrates along a stacking direction, here referred to as "vertical", such that the primary substrates are in a stacked relationship and the major surfaces are substantially perpendicular to the vertical direction;
   (c) spacer means included between the at least two primary substrates such that the spacer means are in touching contact with a major surface of each of the at least two primary substrates and the primary substrates are separated by a predetermined distance, the spacer means comprising multiple, essentially independent channels for conducting electricity in a substantially vertical direction;
   (d) impelling means for causing a coolant fluid to pass substantially in the vertical direction through at least a portion of the stack;
   (e) a pattern of electric conductors formed on at least one major surface of each primary substrate, the conduction pattern overlying the thermally conductive member, such that at least one conductor pattern on a given primary substrate is electrically connected to a conductor pattern on the other primary substrate through at least two independent channels in the spacer means that are included between the primary substrates; and
   (f) at least two electronic integrated circuits overlying and in electrical contact with each conductor pattern such that at least a portion of the heat generated by the integrated circuits flows into the underlying thermally conductive member, wherein
   (g) each primary substrate is divided into an interior region and a peripheral region at least partially surrounding the interior region, each conductor pattern overlies a corresponding interior region, and each peripheral region is perforated by a pattern of holes such that heat flowing from integrated circuits into the corresponding thermally conductive member can flow toward the holes;
   (h) the impelling means cause the coolant fluid to pass through at least some of the holes of each primary substrate; and
   (i) the predetermined distance between primary substrates is adapted to cooperate with the hole patterns to create turbulence in the coolant flow which enhances thermal contact between the coolant fluid and at least one major surface of each base member, resulting in efficient heat exchange at the major surface.

2. The article of claim 1, wherein each of the primary substrates comprises a composite, laminated body which includes at least one electrically conductive layer that is distinct and electrically insulated from the thermally conductive member.

3. The article of claim 1, wherein the holes in a given primary substrate occupy staggered positions relative to the holes of the other primary substrate.

4. The article of claim 1, wherein the thermally conductive members are copper core layers about 40 mils (1.02 mm) in thickness, and the predetermined distance between primary substrates is at least about 75 mils (1.91 mm) but not more than about 200 mils (5.08 mm).

5. The article of claim 1, wherein each primary substrate comprises a thermally conductive composite printed wiring board structure.

6. The article of claim 1, wherein each primary substrate comprises thermally conductive ceramic.

7. The article of claim 1, wherein each primary substrate has an average thermal power level, and the size of the peripheral region of each primary substrate relates to the thermal power level of that primary substrate, such that primary substrates with greater thermal power levels have larger peripheral regions.

8. The article of claim 1, wherein each primary substrate has an average thermal power level, each peripheral region has a hole diameter and an average hole density, and the hole diameter and average hole density of each peripheral region relate to the thermal power level of the corresponding primary substrate such that primary substrates with greater thermal power levels have smaller hole diameters and larger average hole densities.

9. The article of claim 1, further comprising at least one multichip module mounted on a major surface of each primary substrate and electrically connected to the corresponding pattern of electric conductors.

10. The article of claim 1, wherein the coolant fluid is air, and the impelling means comprise an electric fan.

11. The article of claim 1, wherein the coolant fluid is a liquid, and the impelling means comprise a liquid pump.

* * * * *

UNITED STATES PATENT AND TRADEMARK OFFICE
CERTIFICATE OF CORRECTION

PATENT NO. : 5,049,982

DATED : September 17, 1991

INVENTOR(S) : Yung-Cheng Lee
John M. Segelken

It is certified that error appears in the above-identified patent and that said Letters Patent is hereby corrected as shown below:

On Title Page: Attorney, Agent, or Firm "M. I. Fihston" should read --M. I. Finston--.

Signed and Sealed this

Ninth Day of March, 1993

*Attest:*

STEPHEN G. KUNIN

*Attesting Officer*     *Acting Commissioner of Patents and Trademarks*